United States Patent
Mayer et al.

(10) Patent No.: US 12,013,114 B2
(45) Date of Patent: Jun. 18, 2024

(54) OPTOELECTRONIC DEVICE COMPRISING A LIGHT-EMITTING DIODE WHOSE EMITTED BEAM HAS A VARIABLE INCIDENCE ON DIFFERENT COLOUR CONVERTERS ACCORDING TO A PREDETERMINED SEQUENCE

(71) Applicant: ALEDIA, Échirolles (FR)

(72) Inventors: Frédéric Mayer, Voiron (FR); Olivier Jeannin, Grenoble (FR)

(73) Assignee: ALEDIA, Échirolles (FR)

( * ) Notice: Subject to any disclaimer, the term of this patent is extended or adjusted under 35 U.S.C. 154(b) by 241 days.

(21) Appl. No.: 17/418,482

(22) PCT Filed: Dec. 23, 2019

(86) PCT No.: PCT/FR2019/053288
§ 371 (c)(1),
(2) Date: Jun. 25, 2021

(87) PCT Pub. No.: WO2020/136348
PCT Pub. Date: Jul. 2, 2020

(65) Prior Publication Data
US 2022/0074572 A1    Mar. 10, 2022

(30) Foreign Application Priority Data

Dec. 28, 2018 (FR) ...................... 18/74317

(51) Int. Cl.
*H04N 9/31* (2006.01)
*F21V 9/45* (2018.01)
(Continued)

(52) U.S. Cl.
CPC ............... *F21V 9/45* (2018.02); *G09G 3/007* (2013.01); *G09G 3/32* (2013.01); *F21Y 2115/10* (2016.08)

(58) Field of Classification Search
None
See application file for complete search history.

(56) References Cited

U.S. PATENT DOCUMENTS

2014/0043370 A1   2/2014  Payne et al.
2016/0191870 A1*  6/2016  Hajjar ................... G09G 3/002
                                                         353/31

(Continued)

OTHER PUBLICATIONS

International Search Report dated Mar. 23, 2020 re: Application No. PCT/FR2019/053288, pp. 1-2, citing: US 2017018688 A1, US 2014043370 A1 and US 2018239189 A1.

*Primary Examiner* — Carl Adams
(74) *Attorney, Agent, or Firm* — CANTOR COLBURN LLP

(57) ABSTRACT

An optoelectronic device includes a number of pixels, with each pixel including a lighting mechanism having at least one light-emitting diode capable of emitting an initial light beam, a light-conversion module having a plurality of conversion pads including at least one primary conversion pad and at least one secondary conversion pad. Each pixel includes a light-adjustment system configured to control at least one element chosen from a relative position between the lighting mechanism and the light-conversion module and the initial light beam. The action of the light-adjustment system is adapted so that the primary conversion pad and the secondary conversion pad emit a first light beam and a second light beam respectively, from the initial light beam, simultaneously or alternately in a predetermined sequence.

18 Claims, 5 Drawing Sheets

(51) Int. Cl.
  *G02B 26/10* (2006.01)
  *G09G 3/00* (2006.01)
  *G09G 3/32* (2016.01)
  *F21Y 115/10* (2016.01)

(56) References Cited

U.S. PATENT DOCUMENTS

2017/0018688 A1 1/2017 Mazed et al.
2018/0239189 A1 8/2018 Koito

* cited by examiner

[Fig. 1]
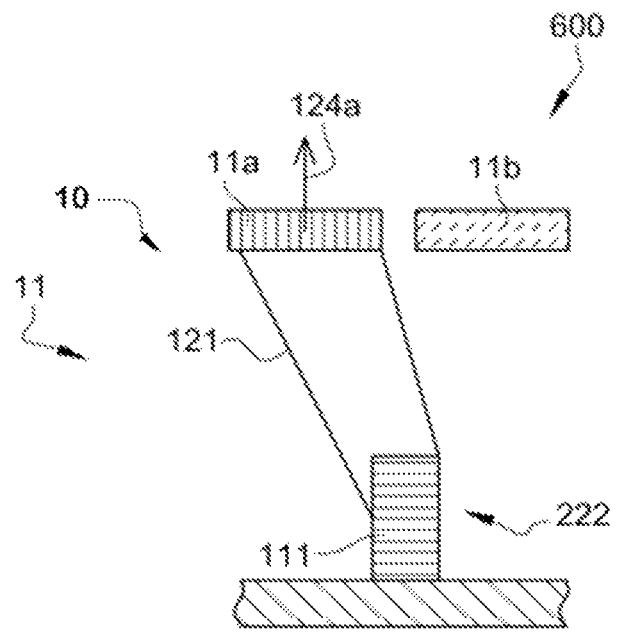
[Fig. 2]
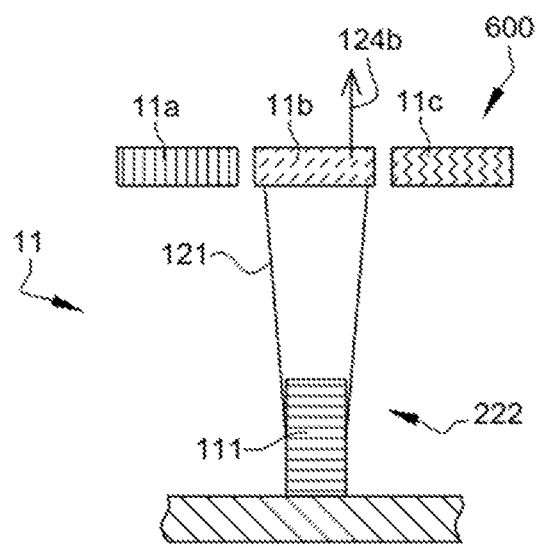

[Fig. 3]
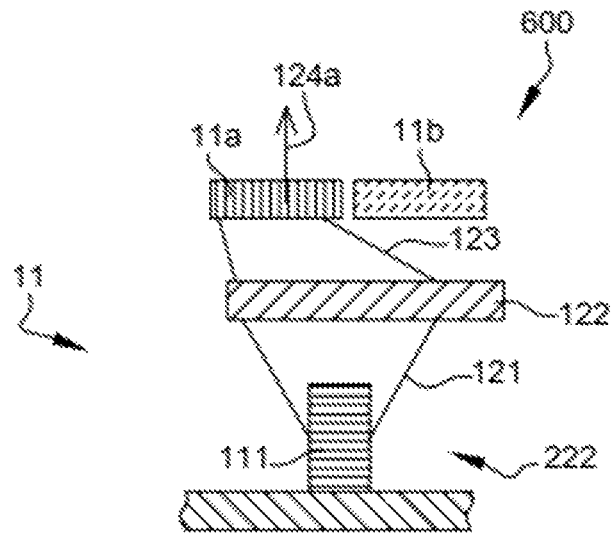
[Fig. 4]
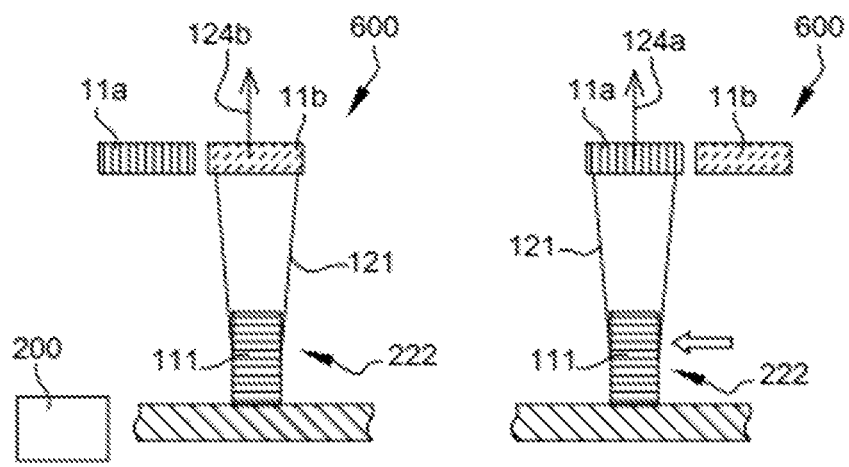

[Fig. 5]
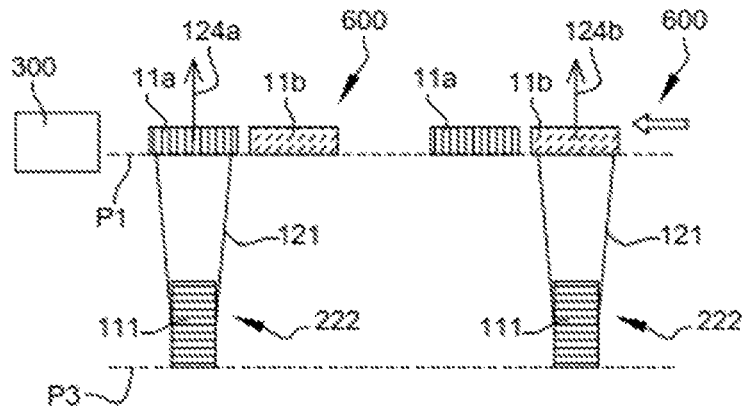
[Fig. 6]
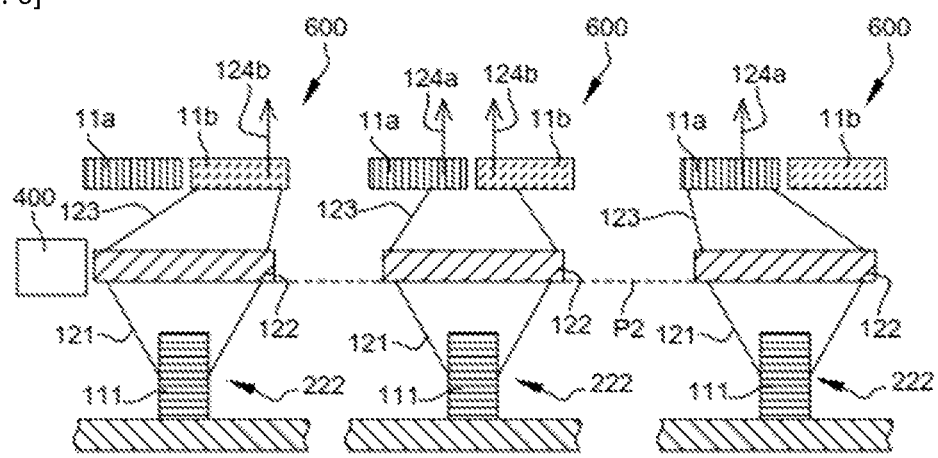
[Fig. 7]
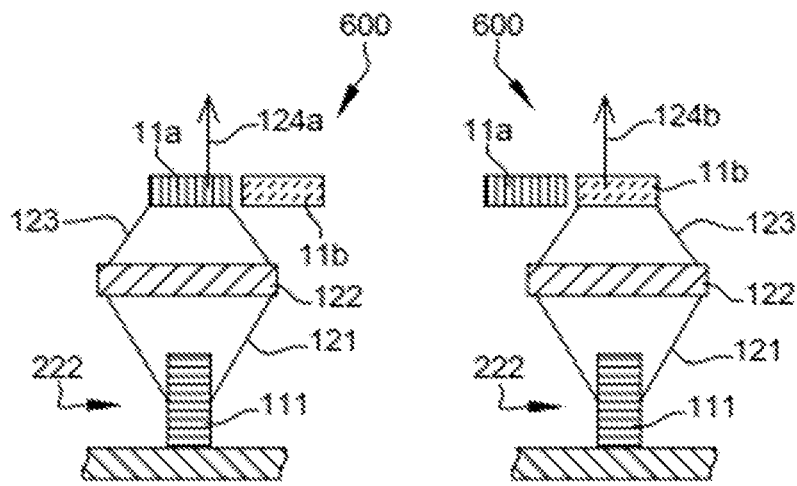

[Fig. 8]
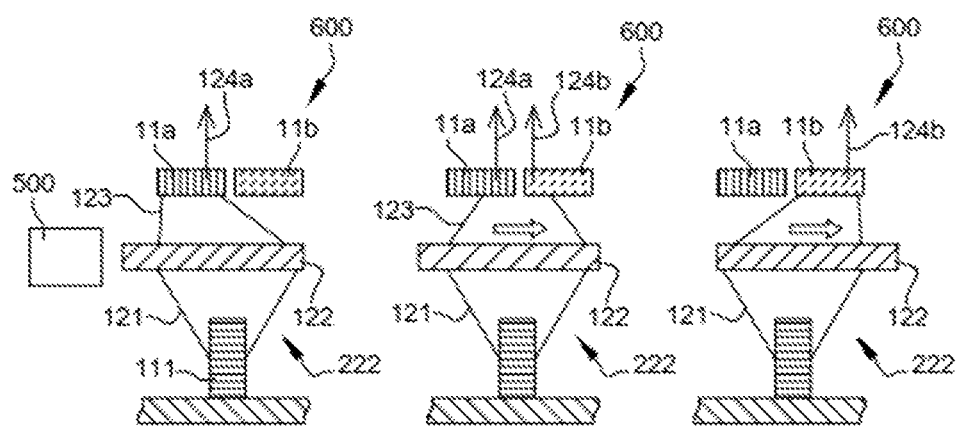
[Fig. 9]
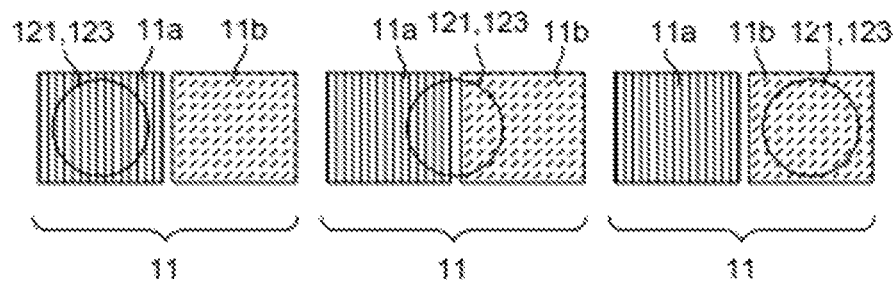

[Fig. 10]
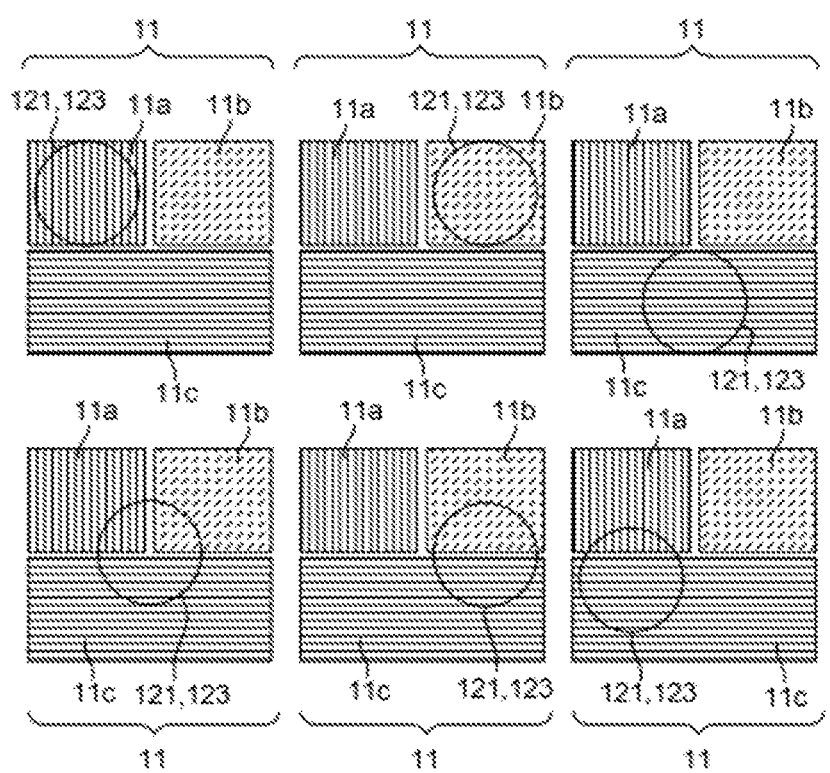

OPTOELECTRONIC DEVICE COMPRISING A LIGHT-EMITTING DIODE WHOSE EMITTED BEAM HAS A VARIABLE INCIDENCE ON DIFFERENT COLOUR CONVERTERS ACCORDING TO A PREDETERMINED SEQUENCE

TECHNICAL FIELD

The present disclosure concerns an optoelectronic device comprising a plurality of pixels, each pixel being adapted to emit light beams of different colors.

The disclosure also concerns a method for piloting an optoelectronic device.

The disclosure finds application in particular in display screens or images projection systems.

BACKGROUND

By optoelectronic device, it should be understood herein a device adapted to perform the conversion of an electrical signal into an electromagnetic radiation to be emitted, in particular light.

There are optoelectronic devices including light-emitting diodes, also known under the acronym LED, formed on a substrate.

It is known that each light-emitting diode comprises an active material exploiting quantum wells, or not, a semiconductor portion doped according to a first doping type to serve as a P-doped junction and a semiconductor portion doped according to a second doping type to serve as a N-doped junction.

Each light-emitting diode may be formed based on three-dimensional or planar semiconductor elements, having micrometric or nanometric dimensions.

There are optoelectronic devices including an array of light-emitting diodes distributed over a determined emission surface throughout which is transmitted, directly or after conversion, the light radiation originating from the light-emitting diodes. In particular, such optoelectronic devices may be used in the making of display screens or images projection systems, where the array of light-emitting diodes actually defines an array of light pixels where each pixel conventionally includes at least one sub-pixel for generating each color, each sub-pixel containing, in turn, at least one light-emitting diode. For example, a sub-pixel may contain up to 100000 light-emitting diodes.

The current trend consists in increasing the definition of the screens, but this induces major difficulties that should be overcome. One of them is that the dimensions between the sub-pixels and the dimensions of each sub-pixel become micrometric, or nanometric, and the use of three-dimensional light-emitting diodes becomes inevitable with increasingly smaller diameters of three-dimensional light-emitting diodes. Yet, the luminous intensity emitted by the nanometric light-emitting diodes declines drastically as the size of the light-emitting diodes is reduced.

Another difficulty is how to ensure that the light radiation emitted by the wire-shaped light-emitting diodes of a determined sub-pixel does not mix with the light radiation emitted by the light-emitting diodes of an adjacent sub-pixel in order to improve the contrasts. Yet, this problem turns out to be more and more difficult given the increasing miniaturization of light-emitting diodes.

Another difficulty arises from the fact that the light emitted by a wired three-dimensional diode is not directional to the extent that the light beams composing this light are not emitted substantially in the same direction. This results in a considerable radiation loss by emission in undesirable directions, thereby causing a drop in light extraction.

A known solution consists in forming light confinement walls adapted to block the transmission of the light radiation emitted by at least one determined light-emitting diode towards at least one adjacent light-emitting diode.

But this known technique has the drawback of not really improving the directional nature of the light emitted by each light-emitting diode.

Another difficulty is that in order to obtain an optoelectronic device adapted to represent multicolor images, it might be necessary to obtain pixels where each sub-pixel is adapted to emit different colors. For this purpose, it is known to provide for each sub-pixel comprising a light conversion module delimiting a plurality of conversion pads adapted to emit at the output light radiation of different colors, respectively. Typically, it is possible to provide for the presence of at least one luminophore at the level of at least one of these conversion pads. Each conversion pad is intended to receive the light originating from at least one light-emitting diode that is associated thereto. But these manufacturing techniques are not satisfactory considering the current demand for miniaturization.

SUMMARY

The present disclosure aims to provide an optoelectronic device, where each pixel has a multicolor light emission, addressing all or part of the problems set out hereinbefore.

In particular, to the disclosure provides a solution addressing at least one of the following advantages:
improve the directional nature of the light emitted by each pixel;
improve the luminous efficacy of the optoelectronic device;
facilitate the implementation of the optoelectronic device in terms of manufacture and piloting and light display;
reduce the size of the pixels;
reduce the space between the pixels.

This can be achieved thanks to the provision of an optoelectronic device comprising a plurality of pixels, each pixel being adapted to emit light beams of different colors and comprising:
a unique illumination mechanism comprising at least one light-emitting diode adapted to emit an initial light beam,
a light conversion module including a plurality of conversion pads including at least one primary conversion pad adapted to emit a first light radiation corresponding to a first color from the initial light beam and at least one secondary conversion pad adapted to emit a second light radiation corresponding to a second color from the initial light beam,
besides, a light adjustment system configured to act on at least one element selected from a relative position between the illumination mechanism and the light conversion module and the initial light beam the action of the light adjustment system being adapted so that the primary conversion pad and the secondary conversion pad respectively emit the first light radiation and the second light radiation from the initial light beam simultaneously or alternately according to a predetermined sequence.

Some preferred, yet non-limiting, aspects of the optoelectronic device are as follows.

The light adjustment system includes an optical system arranged between the illumination mechanism and the light conversion module, the optical system acting on the initial light beam so as to optically transform it.

The optical system comprises at least one optical lens arranged between the illumination mechanism and at least one conversion pad selected from the primary conversion pad and the secondary conversion pad. The optical lens is configured to be crossed by the initial light beam and to emit, by optical transformation of the initial light beam, a transformed light beam at least partially made directional with respect to the initial light beam and reaching at least one conversion pad selected from the primary conversion pad and the secondary conversion pad.

The light adjustment system comprises a lens displacing mechanism adapted so as to ensure a displacement of the optical lens according to a displacement sequence adapted so that the transformed light beam is incident on the primary conversion pad and on the secondary conversion pad simultaneously or alternately according to an incidence alternation ensuring said predetermined sequence for the emission of the first and second light radiations.

The lens displacing mechanism lens comprises piezoelectric actuators and/or micro-actuators such as piezoelectric materials and/or electroactive polymers and/or shape-memory alloys and/or magnetic actuators.

The light adjustment system comprises transformation elements for varying an optical configuration of the optical lens having an influence on the way the initial light beam is transformed and the way the transformed light beam is emitted, according to a sequence of variation of the optical configuration adapted so that the transformed light beam is incident on the primary conversion pad and on the secondary conversion pad simultaneously or alternately according to an incidence alternation ensuring said predetermined sequence for the emission of the first and second light radiations.

The transformation elements for varying an optical configuration of the optical lens comprise piezoelectric elements in the optical lens and/or micro-actuators such piezoelectric materials and/or electroactive polymers and/or shape-memory alloys and/or magnetic actuators and/or actuatable liquid crystals embedded by the optical lens.

The primary conversion pad and the secondary conversion pad are generally arranged in a first plane, the optical lens is generally arranged in a second plane and the illumination mechanisms of the plurality of pixels are generally distributed over a third plane, the first plane, the second plane and the third plane being substantially parallel to each other.

The light adjustment system comprises a light conversion module displacing mechanism acting on the light conversion module so as to ensure a displacement of the primary conversion pad and/or of the secondary conversion pad according to a displacement sequence adapted so that the initial light beam or the transformed light beam is incident on the primary conversion pad and on the secondary conversion pad simultaneously or alternately according to an incidence alternation ensuring said predetermined sequence for the emission of the first and second light radiations.

The light conversion module displacing mechanism comprises piezoelectric actuators and/or micro-actuators such as piezoelectric materials and/or electroactive polymers and/or shape-memory alloys and/or magnetic actuators.

The light adjustment system comprises an illumination mechanism displacing mechanism adapted to ensure a displacement of the illumination mechanism according to a displacement sequence adapted so that the initial light beam or the transformed light beam is incident on the primary conversion pad and on the secondary conversion pad simultaneously or alternately according to an incidence alternation ensuring said predetermined sequence for the emission of the first and second light radiations.

The illumination mechanism displacing mechanism piezoelectric actuators and/or micro-actuators such as piezoelectric materials and/or electroactive polymers and/or shape-memory alloys and/or magnetic actuators.

The initial light beam or the transformed light beam is configured so as to be able to be incident simultaneously on a portion of the primary conversion pad and on a portion of the secondary conversion pad.

The light adjustment system imposes that the predetermined sequence for the emission of the first and second light radiations has a frequency f for the emission alternations of the conversion pads of the pixel, expressed in Hz, such that f≥24*n where n is the number of conversion pads of the pixel.

The light conversion module comprises at least one luminophore at the level of at least one conversion pad selected from the primary conversion pad and the secondary conversion pad.

The disclosure also covers the implementation of a method for piloting an optoelectronic device comprising a plurality of pixels where each pixel is adapted to emit light beams of different colors and comprises:
- a unique illumination mechanism comprising at least one light-emitting diode adapted to emit an initial light beam,
- a light conversion module including a plurality of conversion pads including at least one primary conversion pad adapted to emit a first light radiation corresponding to a first color from the initial light beam and at least one secondary conversion pad adapted to emit a second light radiation corresponding to a second color from the initial light beam,
- the method comprising a main phase including the following steps:
- a) emission of the initial light beam by the illumination mechanism so as to reach the primary conversion pad, resulting in the emission of the first light radiation;
- b) activation of a light adjustment system that each pixel includes, configured to act on at least one element selected from a relative position between the illumination mechanism and the light conversion module and the initial light beam, the activation of the light adjustment system being adapted so that the initial light beam could reach the secondary conversion pad;
- c) emission of the initial light beam by the illumination mechanism so as to reach the secondary conversion pad, resulting in the emission of the second light radiation;
- steps a) and c) being carried out simultaneously or alternately according to a predetermined sequence.

Some preferred, yet non-limiting, aspects of the method are as follows.

The time period between two successive main phases is shorter than 0.042 s.

The main phase is periodically repeated over time.

BRIEF DESCRIPTION OF THE DRAWINGS

Other aspects, objects, advantages and features of the disclosure will appear better on reading the following detailed description of preferred embodiments thereof, provided as a non-limiting example, and made with reference to the appended drawings in which:

FIG. 1 represents a schematic cross-sectional view of an embodiment of an optoelectronic device according to the disclosure containing an illumination mechanism and two distinct conversion pads emitting at different colors;

FIG. 2 represents a schematic cross-section of an embodiment of an optoelectronic device according to the disclosure containing an illumination device and three distinct conversion pads emitting at different colors;

FIG. 3 represents a schematic cross-section of an embodiment of an optoelectronic device according to the disclosure containing an illumination mechanism, and two distinct conversion pads emitting at different colors, and an optical lens;

FIG. 4 represents, in a schematic cross-section, two different configurations occupied by another embodiment of an optoelectronic device according to the disclosure containing an illumination mechanism displacing mechanism, an illumination mechanism and two distinct conversion pads emitting at different colors, the two configurations showing the situations before and after actuation of the illumination mechanism displacing mechanism;

FIG. 5 represents, in a schematic cross-section, two different configurations occupied by another embodiment of an optoelectronic device according to the disclosure containing a light conversion module displacing mechanism, an illumination mechanism and two distinct conversion pads emitting at different colors, the two configurations showing the situations before and after actuation of the light conversion module displacing mechanism;

FIG. 6 represents, in a schematic cross-section, three different configurations occupied by another embodiment of an optoelectronic device according to the disclosure containing an optical lens and an element for varying an optical configuration of the optical lens, the three configurations showing different activations of the element that makes the optical configuration of the optical lens vary;

FIG. 7 represents, in a schematic cross-section, two different configurations occupied by another embodiment of an optoelectronic device according to the disclosure containing a light conversion module displacing mechanism, an illumination mechanism, two conversion pads emitting at two different colors and an optical lens, the two configurations corresponding to the positions occupied by the two conversion pads before and after actuation of the light conversion module displacing mechanism;

FIG. 8 represents, in a schematic cross-section, three different configurations occupied by another embodiment of an optoelectronic device according to the disclosure containing an optical lens and a lens displacing mechanism, the three configurations corresponding to different positions occupied by the lens by actuation of the lens displacing mechanism;

FIG. 9 represents, according to a top view, three different configurations occupied by another embodiment of an optoelectronic device according to the disclosure containing two conversion pads emitting according to different colors illuminated simultaneously and alternately by an initial light beam; and FIG. 10 represents, according to a top view, six different configurations occupied by an optoelectronic device according to the disclosure containing here conversion pads emitting according to three different colors illuminated simultaneously and alternately by an initial light beam.

DETAILED DESCRIPTION OF THE DRAWINGS

In FIGS. 1 to 10 and in the following description, the same reference numerals represent functionally identical or similar elements. In addition, the different elements are not represented to scale so as to enhance clarity of the figures to facilitate understanding thereof. Moreover, the different embodiments and variants do not exclude one another and may be combined together.

In the following description, unless indicated otherwise, the terms «substantially», «about», «generally» and «in the range of» mean «within 10%».

The disclosure first covers an optoelectronic device 10 including a plurality of pixels 11 where each pixel 11 is adapted to emit light beams characterized by different colors.

For exclusively illustrative purposes, but without limitation, each of FIGS. 1 to 10 represents only one pixel 11 of the optoelectronic device 10. This does not exclude in any manner whatsoever the fact that the optoelectronic device 10 includes a plurality of pixels 11, typically distributed like a matrix in two dimensions, in order to address needs in applications such display screens or image projection systems.

Each pixel 11 includes a surrounding light conversion module 600 including several conversion pads, adapted, in turn, to emit light beams of different colors, including at least one primary conversion pad 11a and one secondary conversion pad 11b. The pixel 11 may also comprise at least one tertiary conversion pad 11c in addition to the primary and secondary conversion pads 11a, 11b. The number of primary conversion pads 11a, of secondary conversion pads 11b and possibly of tertiary conversion pads 11c, as such, is not limited within each pixel 11.

Each pixel 11 comprises one single illumination mechanism 222 to illuminate, in a sequenced manner, different conversion pads that the pixel 11 includes. The illumination mechanism 222 essentially comprises at least one light-emitting diode 111. In general, the illumination mechanism 222 may also comprise light collimation means such as for example reflective or opaque walls located on either side of said at least one light-emitting diode 111 and adapted to concentrate or to make at least partially directional the light beam emitted by the illumination mechanism 222 towards the conversion pads 11a, 11b, 11c.

Thus, the illumination mechanism 222 is adapted to emit an initial light beam 121, in particular from the light beam emitted by said at least one light-emitting diode 111. Afterwards, this initial light beam 111 is, directly or indirectly, made incident on a rear face of the different conversion pads 11a, 11b and possibly 11c of the pixel 11 in the above-mentioned simultaneous or alternate manner.

As mentioned hereinbefore, each pixel 11 therefore also comprises the surrounding light conversion module 600 including the primary 11a and secondary 11b conversion pads, and possibly the tertiary conversion pad 11c. The primary conversion pad 11a is adapted to emit a first light radiation 124a corresponding to a first color from the initial light beam 121. The secondary conversion pad 11b is adapted to emit a second light radiation 124b corresponding to a second color from the initial light beam 121. When the light conversion module 600 of the pixel 11 delimits a tertiary conversion pad 11c in addition to the primary and secondary conversion pads 11a, 11b, the tertiary conversion pad 11c is adapted to emit a third light radiation corresponding to a third color from the initial light beam 121. The first, second and third colors are different from each other, so that the pixel 11 could ensure the conventionally expected functions of a pixel dedicated to illuminated display.

Each pixel 11 also comprises a light adjustment system configured to act on the relative position of the light conversion module 600 and of the illumination mechanism 222 and/or on the initial light beam 121.

The action of the light adjustment system is adapted so that the primary conversion pad 11a and the secondary conversion pad 11b respectively emit the first light radiation 124a and the second light radiation 124b from the initial light beam 121 simultaneously or alternately according to a predetermined sequence, the predetermined sequence being, in a non-limiting example, repeated periodically. When the light conversion module 600 of the pixel 11 delimits a tertiary conversion pad 11c in addition to the primary and secondary conversion pads 11a, 11b, the action of the light adjustment system is adapted so that the primary conversion pad 11a, the secondary conversion pad 11b and the tertiary conversion pad 11c emit the first light radiation 124a, the second light radiation 124b and the third light radiation from the initial light beam 121 simultaneously or alternately according to a predetermined sequence. In a non-limiting example, this predetermined sequence may be repeated periodically, for example so as to generate a colors mix effect and thus obtain an average color resulting from the sum of the colors generated at each alternation of the sequence and of the duration of generation of each of said colors.

For example, the light adjustment system and its constituent elements are electromagnetically and/or mechanically piloted by one or several control module(s) in order to display, via the matrix of pixels 11, one or several image(s). Besides, there will be described later on a method for piloting the optoelectronic device, which could be considered as a method for displaying an image by piloting the optoelectronic device.

In general, each light-emitting diode 111 comprises semiconductor elements including a first portion doped according to a first doping type selected amongst a N or P doping, a second portion forming an active portion which may include confinement means, and a third portion doped according to a second doping type selected amongst a N or P doping. As example, this active portion may comprise one single quantum well. These semiconductor elements may be arranged, preferably in the present optoelectronic device 10, in a three-dimensional manner according to micrometric or nanometric dimensions. Thus, each light-emitting diode 111 typically comprises a wired, conical, frustoconical or pyramidal semiconductor element, for example a microwire or a nanowire. Nonetheless, the embodiments may also be implemented for planar light-emitting diodes 111, that is to say light-emitting diodes 111 formed from a stacking of planar semiconductor layers.

In the description and in the figures, the embodiments are described for the non-limiting particular case of wire-shaped light-emitting diodes 111. In general, each light-emitting diode 111 is connected to a lower first electrode (not represented and which may be a seed layer), formed in a substrate, whether continuous or not. Those skilled in the art could refer, for example to the patent application FR-A1-3053530 for the provision of such a substrate containing the adapted lower electrodes. The straight section of the light-emitting diodes 111 may have different shapes such as, for example, an oval, circular or polygonal shape (for example square, rectangular, triangular, hexagonal). The active layer of the light-emitting diodes 111 is the layer from which most of the radiation output by the light-emitting diode 111 is emitted. It may include means for confining the electric charge carriers, such as quantum wells. For example, it is constituted by an alternation of GaN and InGaN layers. The GaN layers may be doped. Alternatively, the active layer is constituted by one single InGaN layer. In general, the light-emitting diodes 111 may be obtained by any technique of a person skilled in the art such as for example: a chemical vapor deposition called «CVD», an atomic layer deposition called «ALD», or a physical vapor deposition called «PVD» or by epitaxy (for example according to the so-called «MBE» technique corresponding to the acronym of the term «Molecular Beam Epitaxy» or according to the so-called «MOVPE» technique corresponding to the acronym term «Metal Organic Vapor Phase Epitaxy» or according to the Hydride Vapor Phase Epitaxy technique. As example, the light-emitting diodes 111 may be made, at least partially, of semiconductor materials from the group IV such as silicon or germanium or mostly including a III-V compound, for example III-N compounds. Examples from the group III comprise gallium, indium or aluminum. Examples of III-N compounds are GaN, AlN, InGaN or AlInGaN. Other elements from the group V may also be used, for example, phosphorus, arsenic or antimony. In general, the elements in the III-V compound may be combined with different molar fractions. It should be set out that the light-emitting diodes 111 may indifferently be formed from semiconductor materials including mostly a II-VI compound. The dopant may be selected, in the case of a III-V compound, from the group comprising a P-type dopant from the group II, for example magnesium, zinc, cadmium or mercury, a P-type dopant from the group IV for example carbon, or a N-type dopant from the group IV, for example silicon, germanium, selenium, sulfur, terbium or tin. Even though it is possible to consider light-emitting diodes 111 emitting a light radiation of any color, it could be advantageous to use light-emitting diodes 111 adapted to emit light radiations corresponding to a blue or ultraviolet color. Indeed, these colors are the most effective in combination with luminophore-type color conversion pads to obtain other colors such as red or green. The light-emitting diodes 111 may also be laser diodes such as for example vertical-cavity surface-emitting laser light-emitting diodes «VCSEL».

The emission mechanism 222 may also comprise at least one optical lens (not represented and distinct from the optical lens 122 described later on) to collimate and/or focus and/or make as much directional as possible the light radiation coming directly from the light-emitting diodes 111. The illumination mechanism 222 generates an initial light beam 121, for example derived from the interaction of the above-mentioned elements.

In another embodiment illustrated in FIGS. 3, 6, 7 and 8, the optoelectronic device 10 comprises an optical system arranged between the illumination mechanism 222 and the light conversion module 600. As it will be detailed, this optical system, which is intended to optically transform the initial light beam 121 so as to thereby emit a transformed light beam 123, may include at least one optical lens 122.

Afterwards, the initial light beam 121 generated in this manner by the illumination mechanism 222 (directly in case of absence of the optical system or indirectly in case of possible interposition of the optical system) reaches the surrounding light conversion module 600 including the different conversion pads 11a, 11b and possibly 11c. The primary conversion pad 11a is adapted to emit, at the level of an output face, the first light radiation 124a corresponding to the first color from the initial light beam 121. For this purpose, the light conversion module 600 may, for example, contain color converters such as luminophores at the level of the area delimiting the primary conversion pad 11a. Thus, by absorption of the initial light beam 121 or of the transformed light beam 123 detailed later on incident on the rear face, the color converters, in turn, emit at the front face a first light radiation 124*a* with a preferably different wavelength determined by their intrinsic nature. The same applies for the secondary conversion pads 11*b* and the tertiary conversion pads 11*c*, through an adaptation of the color converters contained in the light conversion module 600 at the level of the secondary 11*b* and tertiary 11*c* conversion pads. To obtain radiations of different colors at the output of the light conversion module 600, in particular a first radiation 124*a* and a second radiation 124*b* and optionally a third radiation, it is possible to use converters of different color at the level of the three conversion pads. Alternatively, it is possible, and even advantageous, to provide, at the level of one of the conversion pads 11*a*, 11*b* and possibly 11*c*, for the light conversion module 600 containing no color converter and/or being transparent to the initial light beam 121 or to the transformed light beam 123 possibly transformed by the optical system described later on. Thus, in the case where the initial light beam 121 is advantageously blue-colored for the aforementioned reasons, this blue color may be visible through the light conversion module 600 without undergoing any color conversion within the light conversion module 600. For example, the conversion pads comprise color converters which may be formed with photoluminescent pads, also called luminophores: each photoluminescent pad is designed so as to absorb at least one portion of the light, for example blue-colored, coming from the illumination mechanism 222 and to emit a light of a different color, for example green or red, in response. These photoluminescent pads are usually disposed in a suitable photosensitive binder matrix for example made of silicon. The photoluminescent pads may be formed by an aluminate, a silicate, a nitride, a fluoride or a sulfide. The average size of such photoluminescent pads is comprised between 1 μm and 20 μm, preferably between 1 μm and 10 μm, even more preferably between 1 μm and 8 μm. According to one example, the photoluminescent pads comprise an aluminate, in particular an aluminum and yttrium garnet, for example according to the formula $Y_3Al_5O_{12}$:Ce (also known under the formula YAG:Ce or YAG:Ce3+), $(Y,Gd)_3Al_5O_{12}$:Ce, $Tb_3Al_5O_{12}$, $(Y,Tb)_3Al_5O_{12}$, $Lu_3Al_5O_{12}$:Ce and $Y_3(Al,Ga)_5O_{12}$. According to another example, this aluminate also comprises elements selected from the elements comprising rare earths, alkaline earth metals and transition metals such as cerium, samarium, gadolinium, silicon, barium, terbium, strontium, chromium, praseodymium and gallium. Nitrides absorbing and emitting light in the desired wavelength ranges can also be used, for example materials such as $CaAlSiN_3$:Eu, $(Ca,Sr)AlSiN_3$:Eu, $Ca_2Si_6N_8$:Eu or $(Ca,Sr)Si_6N_8$:Eu. Fluorides absorbing and emitting light are for example the materials of formula $K_2MF_6$:Mn (where M may be Si, Ge, Sn or Ti). The sulfides absorbing and emitting light are for example the materials of formula CaS:Eu, SrCa:Eu, (Sr,Ca)S:Eu and $SrGa_2S_4$:Eu. The silicates absorbing and emitting light are for example the materials of formula $(Sr,Ba)_2SiO_4$:Eu, $Ba_2SiO_4$:Eu, $Ca_2SiO_4$:Eu, $Ca_3SiO_6$:Eu and $Sr_3SiO_6$:Eu. According to an example, the photoluminescent pads comprise nanometric-sized crystals and are made of a semiconductor material. The photoluminescent pads are then semiconductor nanocrystals whose average size is comprised between 0.5 nm and 1000 nm, preferably from 0.5 nm to 500 nm, even more preferably from 1 nm to 100 nm, in particular from 2 nm to 30 nm. For dimensions smaller than 50 nm, the photoconversion properties of the semiconductor nanocrystals essentially depend on quantum confinement phenomena. The semiconductor nanocrystals then correspond to quantum dots. According to one embodiment, the semiconductor material of each semiconductor nanocrystal is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), zinc and cadmium selenide (CdZnSe), silver indium sulfide (AgInS2), $PbScX_3$-type perovskites where X is a halogen atom, in particular iodine (I), bromine (Br) or chlorine (Cl), and a mixture of at least two of these compounds. According to another example, the dimensions of the semiconductor nanocrystals are selected according to the pursued wavelength for the radiation emitted by the semiconductor nanocrystals. As example, cadmium selenide nanocrystals whose average size is in the range of 3.6 nm are suited to convert blue light into red light and cadmium selenid nanocrystals whose average size is in the range of 1.3 nm are suited to convert blue light into green light.

As presented before, the primary conversion pad 11*a* and the secondary conversion pad 11*b* could emit the first light radiation 124*a* and the second light radiation 124*b* from the initial light beam 121 simultaneously and possibly statically over time. This advantageously allows saving energy.

The predetermined sequence, which is optionally repeated periodically, may comprise the following sub-sequences:
 i) incidence of the initial light beam 121 or of the transformed light beam 123 on at least one portion of the area of the light conversion module 600 delimiting the primary conversion pad 11*a* during a first time period so that the primary conversion pad 11*a* emits the first light radiation 124*a* during this first time period,
 ii) incidence of the initial light beam 121 or of the transformed light beam 123 on at least one portion of the area of the light conversion module 600 delimiting the secondary conversion pad 11*b* during a second time period so that the secondary conversion pad 11*b* emits the second light radiation 124*b* during this second time period,
 iii) optionally, incidence of the initial light beam 121 or of the transformed light beam 123 on at least one portion of the area of the light conversion module 600 delimiting the tertiary conversion pad 11*c* during a third time period so that the tertiary conversion pad 11*c* emits the third light radiation during this third time period,
 iv) optionally, at least one incidence of the initial light beam 121 or of the transformed light beam 123 both on a portion of the light conversion module 600 delimiting one of the conversion pads 11*a*, 11*b*, 11*c* and on a portion of the area of the light conversion module 600 delimiting another one of the conversion pads 11*a*, 11*b*, 11*c*, for a determined time period in order to provide for a mixing of the light radiations likely to be emitted by the conversion pads 11*a*, 11*b*, 11*c*.

The first time period during which the sub-sequence i) is implemented, the second time period during which the sub-sequence ii) is implemented, the possible third time period during which the sub-sequence iii) is implemented and the possible time period during which the sub-sequence iv) is implemented may be identical to each other or different from each other.

The predetermined sequence that could be repeated periodically may optionally further comprise a sub-sequence corresponding to a stoppage of light emission by the illumination mechanism 222 for a determined time period between the sub-sequence i) and the sub-sequence ii) and/or between the sub-sequence ii) and the sub-sequence iii) and/or between the sub-sequence iii) and the sub-sequence iv).

It is also possible to provide for a stoppage of the light emission by the illumination mechanism 222 between two successive phases of implementation of the predetermined sequence.

FIG. 1 illustrates an embodiment where the pixel 11 respectively comprises a primary conversion pad 11a and a secondary conversion pad 11b, the whole occupying a configuration, provided only as example, which comprises lighting up the primary conversion pad 11a, by direct incidence on its rear face, by the initial light beam 121 coming from the illumination mechanism 222.

FIG. 2 illustrates another embodiment where the pixel 11 respectively comprises a primary conversion pad 11a, a secondary conversion pad 11b and a tertiary conversion pad 11c (which remains optional), the whole occupying a configuration, provided only as example, which comprises lighting up the secondary conversion pad 11b, by direct incidence on its rear face, by the initial light beam 121 coming from the illumination mechanism 222.

Opaque walls (not represented) may be formed between the conversion pads 11a, 11b, 11c so as to prevent the first, second and optionally third radiations 124a, 124b from interfering with each other.

As example, the light adjustment system that each pixel 11 includes mechanically acts on the light conversion module 600, at the level of the area that delimit the conversion pads 11a, 11b and possibly 11c or more preferably on a support on which the conversion pads are attached, thereby allowing moving them securely together. The mechanical action may be performed by deformation or, more advantageously, by displacement. Thus, as illustrated in FIG. 5 as example, the light adjustment system that each pixel 11 includes may comprise a light conversion module displacing mechanism 300 acting on the light conversion module 600 to ensure a displacement of the primary conversion pad 11a and/or of the secondary conversion pad 11b, and also possibly of the tertiary conversion pad 11c when the light conversion module 600 of the pixel 11 further delimits conversion pads 11a, 11b thereof. This displacement is then performed according to a displacement sequence adapted so that the initial light beam 121 or the transformed light beam 123 described hereinafter is, sequentially, incident on the primary conversion pad 11a and on the secondary conversion pad 11b, and possibly on the tertiary conversion pad 11c, according to an incidence alternation ensuring said predetermined sequence for the emission of the first light radiation 124a emitted by the secondary conversion pad 11b, and possibly of the third light radiation emitted by the tertiary conversion pad 11c. The light conversion module displacing mechanism 300 provides for a displacement of the conversion pads of the pixel 11 according to an overall movement during which they remain attached to one another within the same pixel 11, or alternatively according to a selective movement where part of the conversion pads of the pixel 11 are displaced relative to the remaining conversion pads of the same pixel 11. In one example, the light conversion module displacing mechanism 300 provides for a displacement of the conversion pads of the pixel 11 as well as of the conversion pads of the adjacent pixels, together.

According to a non-limiting embodiment, the light conversion module displacing mechanism 300 comprises piezoelectric actuators and/or micro-actuators such as piezoelectric materials and/or electroactive polymers and/or shape-memory alloys and/or magnetic actuators.

In FIG. 5 which constitutes an example, the primary conversion pad 11a and the secondary conversion pad 11b are generally arranged in a first plane P1 and the illumination mechanism 222 is arranged in a plane P3. The planes P1 and P3 are generally parallel. Thus, all it needs is to provide for the light conversion module displacing mechanism 300 making the light conversion module 600 move generally parallel to the plane P1 so that the conversion pads 11a, 11b, 11c are illuminated by the initial light beam 121 or the transformed light beam 123 sequentially, this incidence sequence of the light beam 121 or 123 being directly dependent of the displacement sequence imposed onto the light conversion module 600 by the light conversion module displacing mechanism 300 in the plane P1.

As illustrated in FIGS. 9 and 10, in order to obtain a mixed color, the initial light beam 121 or the transformed beam 123 may, for example, also illuminate simultaneously, and in one example statically over time, only a portion of one of the conversion pads 11a, 11b, 11c of the pixel and a portion of another one of the conversion pads 11a, 11b, 11c of the same pixel 11. These arrangements may be obtained by adapting the surface of incidence of the initial light beam 121 or of the transformed light beam 123, in particular by acting on all of the optical parameters having an influence on this surface of incidence. Lighting up of the conversion pads 11a, 11b by the initial light beam 121 may be governed by a predetermined sequence.

Another example for obtaining a mixed color is to implement a displacement of the light conversion module 600 between two phases of the predetermined sequence. It is then advantageously possible to obtain a color that will appear, to the human eye, for example as an average of the colors of the first and second radiations 124a, 124b obtained through the sequenced lighting up of the primary and secondary conversion pads 11a, 11b.

More generally, to obtain a mixed color, it is advantageous that the time period between two phases of implementation of the predetermined sequence is shorter than or equal to 1/(24*n) seconds, where n is the number of lit-up conversion pads of the pixel 11. In other words, the light adjustment system imposes that the predetermined sequence for the emission of the first light radiation 124a emitted by the primary conversion pad 11a, of the second light radiation 124b emitted by the secondary conversion pad 11b and possibly of the third light radiation emitted by the tertiary conversion pad 11c, has a frequency denoted f for the emission alternations of the conversion pads of the pixel 11, expressed in Hz, such that f≥24*n. The illumination mechanism 222 could, quite possibly, keep its illumination between two alternations of the predetermined sequence and/or between two successive phases of implementation of the predetermined sequence, so as to avoid making the display jerky and to limit the transition times between the supply of electric power and the illumination.

Referring to FIGS. 3, 6, 7 and 8, the optical system arranged between the illumination mechanism 222 and the light conversion module 600 may comprise at least one optical lens 122 arranged between the illumination mechanism 222 and at least one conversion pad selected from the primary conversion pad 11a and the secondary conversion pad 11b, and possibly the tertiary conversion pad 11c in the case where the light conversion module 600 of the pixel 11 delimits a tertiary conversion pad 11c in addition to the primary and secondary conversion pads 11a, 11b. The optical lens 122 is configured to be crossed by the initial light beam 121 and to emit, by transformation of the initial light beam 121 by collimation and/or focusing and/or deflection and/or concentration, the transformed light beam 123 made at least partially directional with respect to the initial light beam 121. Throughout the entire text, by «made directional», it should be understood «totally or partially collimated and/or focused and/or diverted and/or concentrated». The transformed light beam 123 could reach at least one conversion pad selected from the primary conversion pad 11a and the secondary conversion pad 11b, and possibly the tertiary conversion pad 11c. In one example, the optical lens 122 comprises at least one convex-shaped surface having an input outer surface adapted to be crossed by said initial light beam 121 coming from the illumination mechanism 222. For example, the optical lens 122 may also contain a second output convex surface for focusing again or collimating the initial light beam 123 and emitting the transformed beam 123.

In another example, the optical lens 122 has an axis of revolution. For example, the optical lens 122 may for example have a horseshoe-like convex shape or have a portion truncated according to a plane substantially parallel to the plane P1. Advantageously, the optical lens 122 is made of a material with an optical index comprised between 1.4 and 2 and more preferably between 1.45 and 1.55. For example, the optical lens 122 may be made of borosilicate, glass, silica $SiO_2$, $Al_2O_3$, sapphire, polymer, thermoformable polymer, photosensitive resin, plastic, or of a liquid. The use of an optical lens 122 advantageously enables light extraction from the illumination mechanism 222 since, in the absence of any optical lens 122, part of the light emitted by the illumination mechanism 222 does not reach at least one of the conversion pads 11a, 11b, 11c. This also allows for an increase of the luminous intensity emitted by an illumination mechanism 222 comprising one or several wire-shaped light-emitting diode(s) 11. Indeed, thanks to the use of an optical lens 122, it is possible to consider enlarging the diameter of the light-emitting diodes 111 that compose the illumination mechanism 222. Indeed, by making the light rays originating from the light-emitting diodes 111 as much directional as possible, the light rays no longer interfere and therefore the density of light-emitting diodes 111 could be increased while providing for a large diameter of the light-emitting diodes 111 where necessary. In particular, it is possible and advantageous to provide for the dimensions of the light-emitting diode 111 included within the illumination mechanism 222, viewed in the plane P3, being larger than the dimensions, viewed in the plane P1, of each of the areas of the light conversion module 600 defining the conversion pads 11a, 11b and possibly 11c. This allows effectively countering the miniaturization of the pixels which tends to reduce the luminous efficacy. This configuration is also advantageous for accurately controlling the conversion pad portions reached by the transformed light beam 123. Thus, the ratios of the surfaces of each conversion pad illuminated by the transformed light beam 123 in the same pixel 11, and the resulting color, are accurately obtained. Advantageously, this allows obtaining colors whose saturation is improved. This also allows reducing crosstalk between the pixels and allows for an improvement of contrast.

In one example, the optoelectronic device 10 may include elements in particular absorbent walls, whose implementation by a person skilled in the art is easy, allowing blocking parasitic light rays so that these do not reach other neighboring pixels.

In one embodiment, the light adjustment system each pixel 11 includes optically acts on the optical lens 122.

In a first example, the optical lens 122 is adapted to be dynamically deformed. In this case, the light adjustment system may include transformation elements 400 capable of varying an optical configuration of the optical lens 122 affecting the way the initial light beam 121 is transformed and the way the transformed light beam 123 is emitted, according to an optical configuration variation sequence adapted so that the transformed light beam 123, is sequentially incident on the primary conversion pad 11a and on the secondary conversion pad 11b, and also possibly on the tertiary conversion pad 11c when the light conversion module 600 of the pixel 11 delimits an additional one of the conversion pads 11a, 11b thereof, according to an incidence alternation ensuring said predetermined sequence for the emission of the first light radiation 124a emitted by the primary conversion pad 11a and of the second light radiation 124b emitted by the secondary conversion pad 11b, and possibly of the third light radiation emitted by the tertiary conversion pad 11c.

Thus, the initial light beam 121 may be diverted or focused or undergo a collimation by the deformation of the optical lens 122. For this purpose, the optical lens 122 may for example be formed by one or several liquid(s) and comprise electrodes or piezoelectric elements and/or microactuators such as piezoelectric materials and/or electroactive polymers and/or shape-memory allots and/or magnetic actuators. It may also comprise liquid crystals, capable of being actuated by electric power supply in a way ensuring the deformation of the optical lens 122 as a whole.

FIG. 6 shows several optical configurations of the optical lens 122, allowing describing a predetermined sequence of lighting up the conversion pads 11a, 11b. Thus, in a first optical configuration, the optical lens 122 has a shape such that the transformed light beam 123 lights up the secondary conversion pad 11b. In a second optical configuration, the optical lens 122 has a shape such that the transformed light beam 123 lights up part of the secondary conversion pad 11b and part of the primary conversion pad 11a. In a third optical configuration, the optical lens 122 has a shape such that the transformed light beam 123 lights up only the primary conversion pad 11a. By deforming the optical lens 122, it is thus possible to create a sequence of incidence of the transformed light beam 123 on the conversion pads 11a, 11b and therefore create a sequence of luminous display of several colors, whether mixed or not, from the conversion pads 11a, 11b. These principles described in connection with the particular case of a pixel 11 with two conversion pads 11a, 11b could, quite possibly, be adapted and broadened to the case of a pixel 11 with three conversion pads 11a, 11b, 11c or more.

The optical lens 122 may be composed by several lenses, for example arranged parallel to the plane P1. Thus, for example, by combining a spherical first optical lens and a truncated second optical lens, it is possible to make light rays of the initial light beam 121 parallel and then focus them.

In another embodiment illustrated in FIG. 8, the light adjustment system of the pixel 11 provides for optically acting on the optical system through a mechanical action on the optical lens 122. To this end, the transformation elements 400 capable of making an optical configuration of the optical lens 122 vary comprise a lens displacing mechanism 500 adapted to ensure a displacement of the optical lens 122. As illustrated in FIG. 8, in a first optical configuration of the optical lens 122, the transformed light beam 123 is incident on the area of the light conversion module 600 delimiting the primary conversion pad 11a. In a second optical configuration of the optical lens 122, by the action of the lens displacing mechanism 500, the transformed light beam 123 becomes incident both on a portion of the area of the light conversion module 600 delimiting the primary conversion pad 11a and on a portion of the area of the light conversion module 600 delimiting the secondary conversion pad 11b, thereby causing the emission by the light conversion module 600 of a mixed color corresponding to a mi of the light radiations 124a and 124b proportionally to their surface area lit up by the transformed light beam 123 and possibly to their emission times. In a third optical configuration of the optical lens 122, by the action of the lens displacing mechanism 500, the transformed light beam 123 becomes incident only on the area of the light conversion module 600 delimiting the secondary conversion pad 11b, thereby creating a color corresponding to that one emitted by the secondary conversion pad 11b, that is to say the second light radiation 124b. Thus, the displacement sequence of the optical lens 122 generated by the action of the lens displacing mechanism 500 is adapted so that the transformed light beam 123 is sequentially incident on the primary conversion pad 11a and on the secondary conversion pad 11b, and possibly on the tertiary conversion pad 11c in the case where the light conversion module 600 of the pixel 11 delimits a tertiary conversion pad 11c in addition to the primary and secondary conversion pads 11a, 11b, according to an incidence alternation ensuring said predetermined sequence for the emission of the first light radiation 124a emitted by the primary conversion pad 11a and of the second light radiation 124b emitted by the secondary conversion pad 11b, and possibly of the third light radiation emitted by the tertiary conversion pad 11c. These principles described in connection with the particular case of a pixel 11 with two conversion pads 11a, 11b could, quite possibly, be adapted and broadened to the case of a pixel 11 with three conversion pads 11a, 11b, 11c or more.

In one example, each optical lens 122 is displaced independently for each pixel.

Referring now to FIGS. 9 and 10, it is possible to notice examples of different incidence alternations of the transformed light beam 123 on the conversion pads 11a, 11b and 11c according to the action of the lens displacing mechanism 500. For example, the lens displacing mechanism 500 comprises piezoelectric actuators and/or micro-actuators such as piezoelectric materials and/or electroactive polymers and/or shape-memory alloys and/or magnetic actuators.

As illustrated as example in the figures, the optical lens 122 is generally arranged in a second plane P2 substantially parallel to the planes P1 and P3 which are already substantially parallel to one another. Thus, all it needs is to provide for the lens displacing mechanism 500 making the optical lens 122 move generally parallel to the planes P1, P2 so that the conversion pads 11a, 11b, 11c are sequentially illuminated by the initial light beam 121 or the transformed light beam 123, this incidence sequence of the light beam 121 or 123 being directly dependent of the displacement sequence imposed onto the optical lens 122 by the lens displacing mechanism 500 in the plane P2.

In another embodiment illustrated in FIG. 4, the light adjustment system that each pixel 11 includes provides for mechanically acting on the illumination mechanism 222. While this mechanical action could possibly be obtained by some deformation of all or part of the optoelectronic device 10, it is advantageous to provide for a mechanical action on the illumination mechanism 222 by a displacement of the latter as a whole. Thus, the light adjustment system of each pixel 11 may comprise an illumination mechanism displacing mechanism 200 adapted to ensure a displacement of the illumination mechanism 222. The displacement of the illumination mechanism 200 may allow completing a sequence adapted so that the initial light beam 121 or the transformed light beam 123 are, simultaneously or alternately, incident on the primary conversion pad 11a and on the secondary conversion pad 11b, and possibly on the tertiary conversion pad 11c in the case where the light conversion module 600 of the pixel 11 delimits a tertiary conversion pad 11c in addition to the primary and secondary conversion pads 11a, 11b, according to an incidence alternation ensuring the predetermined sequence for the emission of the first light radiation 124a emitted by the primary conversion pad 11a and of the second light radiation 124b emitted by the secondary conversion pad 11b, and possibly of the third light radiation emitted by the tertiary conversion pad 11c. These principles described in connection with the particular case of a pixel 11 with two conversion pads 11a, 11b could, quite possibly, be adapted and broadened to the case of a pixel 11 with three conversion pads 11a, 11b, 11c or more.

The illumination mechanism displacing mechanism 200 comprises piezoelectric actuators and/or micro-actuators such as piezoelectric materials and/or electroactive polymers and/or shape-memory alloys and/or magnetic actuators.

As indicated before, the disclosure also covers the method for piloting this optoelectronic device 10.

The light display method of the optoelectronic device 10 comprises a main phase, optionally repeated periodically over time, including the following steps:
  a) emission of the initial light beam 121 by the illumination mechanism 222 so as to reach the primary conversion pad 11a, resulting in the emission of the first light radiation 124a,
  b) optional activation of the light adjustment system on at least one element selected from a relative position of the light conversion module 600 and the illumination mechanism 222 and the initial light beam 121, the activation of the light adjustment system being adapted so that the initial light beam 121 could reach the secondary conversion pad 11b,
  c) emission of the initial light beam 121 by the illumination mechanism 222 so as to reach the secondary conversion pad 11b, resulting in the emission of the second light radiation 124b.

Steps a) and c) are carried out simultaneously or alternately according to a predetermined sequence. In the embodiment where steps a) and c) are carried out simultaneously, then it is possible that step b) is not executed.

During step a), in light of all of the previous explanations related to the optional existence of the optical system arranged between the illumination mechanism 222 and the light conversion module 600, it should be understood that either the initial light beam 121 directly reaches the primary conversion pad 11a to cause the emission of the first light radiation 124a, or the initial light beam 121 is transformed by the optical system so as to emit a transformed light beam 123 and it is this transformed light beam 123 that actually reaches the primary conversion pad 11a to cause the emission of the first light radiation 124a.

Similarly, during step c), it should be understood that either the initial light beam 121 directly reaches the secondary conversion pad 11b to cause the emission of the second light radiation 124b, or the initial light beam 121 is transformed by the optical system so as to emit a transformed light beam 123 and it is this transformed light beam 123 that actually reaches the secondary conversion pad 11b to cause the emission of the second light radiation 124b.

In a particularly advantageous embodiment, the time period between two successive main phases is shorter than 0.042 s. This allows making the lighting transitions from one conversion pad to another conversion pad visually invisible to the human eye in the case where the pixel 11 comprises at least three conversion pads emitting at different colors (for example in blue, red and green).

In the case where the light conversion module 600 of the pixel 11 delimits a tertiary conversion pad 11c in addition to the primary and secondary conversion pads 11a, 11b, the main phase being optionally repeated periodically comprises the following steps d) and e):

d) activation of the light adjustment system on at least one element selected from the relative position of the light conversion module 600 and the illumination mechanism 222 and the initial light beam 121, the activation of the light adjustment system being adapted so that the initial light beam 121 could reach the tertiary conversion pad 11c, e) emission of the initial light beam 121 by the illumination mechanism 222 so as to reach the tertiary conversion pad 11c, resulting in the emission of the third light radiation.

During step e), it should be understood that either the initial light beam 121 directly reaches the tertiary conversion pad 11c so as to cause the emission of the third light radiation, or the initial light beam 121 is transformed by the optical system so as to emit a transformed light beam 123 and it is this transformed light beam 123 that actually reaches the tertiary conversion pad 11c so as to cause the emission of the third light radiation.

The invention claimed is:

1. An optoelectronic device comprising a plurality of pixels, each pixel being adapted to emit light beams of different colors, and each pixel comprising:
   a unique illumination mechanism comprising at least one light-emitting diode adapted to emit an initial light beam;
   a light conversion module including a plurality of conversion pads including at least one primary conversion pad adapted to emit a first light radiation corresponding to a first color from the initial light beam and at least one secondary conversion pad adapted to emit a second light radiation corresponding to a second color from the initial light beam; and
   a light adjustment system configured to act on at least one element selected from a relative position between the illumination mechanism and the light conversion module and the initial light beam, the action of the light adjustment system being adapted so that the primary conversion pad and the secondary conversion pad respectively emit the first light radiation and the second light radiation from the initial light beam simultaneously or alternately according to a predetermined sequence.

2. The optoelectronic device according to claim 1, wherein the light adjustment system includes an optical system arranged between the illumination mechanism and the light conversion module, the optical system acting on the initial light beam so as to optically transform it.

3. The optoelectronic device according to claim 2, wherein the optical system comprises at least one optical lens arranged between the illumination mechanism and at least one conversion pad selected from the primary conversion pad and the secondary conversion pad, the optical lens being configured to be crossed by the initial light beam and to emit, by optical transformation of the initial light beam, a transformed light beam at least partially made directional with respect to the initial light beam and reaching at least one conversion pad selected from the primary conversion pad and the secondary conversion pad.

4. The optoelectronic device according to claim 3, wherein the light adjustment system comprises a lens displacing mechanism adapted so as to ensure a displacement of the optical lens according to a displacement sequence adapted so that the transformed light beam is incident on the primary conversion pad and on the secondary conversion pad simultaneously or alternately according to an incidence alternation ensuring said predetermined sequence for the emission of the first and second light radiations.

5. The optoelectronic device according to claim 4, wherein the lens displacing mechanism comprises piezoelectric actuators and/or micro-actuators such as piezoelectric materials and/or electroactive polymers and/or shape-memory alloys and/or magnetic actuators.

6. The optoelectronic device according to claim 3, wherein the light adjustment system comprises transformation elements for varying an optical configuration of the optical lens having an influence on the way the initial light beam is transformed and the way the transformed light beam is emitted, according to a sequence of variation of the optical configuration adapted so that the transformed light beam is incident on the primary conversion pad and on the secondary conversion pad simultaneously or alternately according to an incidence alternation ensuring said predetermined sequence for the emission of the first and second light radiations.

7. The optoelectronic device according to claim 6, wherein the transformation elements for varying an optical configuration of the optical lens comprise piezoelectric elements in the optical lens and/or micro-actuators such piezoelectric materials and/or electroactive polymers and/or shape-memory alloys and/or magnetic actuators and/or actuatable liquid crystals embedded by the optical lens.

8. The optoelectronic device according to claim 3, wherein the primary conversion pad and the secondary conversion pad are generally arranged in a first plane, the optical lens is generally arranged in a second plane and the illumination mechanisms of the plurality of pixels are generally distributed over a third plane, the first plane, the second plane and the third plane being substantially parallel to each other.

9. The optoelectronic device according to claim 1, wherein the light adjustment system comprises a light conversion module displacing mechanism acting on the light conversion module so as to ensure a displacement of the primary conversion pad and/or of the secondary conversion pad according to a displacement sequence adapted so that the initial light beam or the transformed light beam is incident on the primary conversion pad and on the secondary conversion pad simultaneously or alternately according to an incidence alternation ensuring said predetermined sequence for the emission of the first and second light radiations.

10. The optoelectronic device according to claim 9, wherein the light conversion module displacing mechanism comprises piezoelectric actuators and/or micro-actuators.

11. The optoelectronic device according to claim 1, wherein the light adjustment system comprises an illumination mechanism displacing mechanism adapted to ensure a displacement of the illumination mechanism according to a displacement sequence adapted so that the initial light beam or the transformed light beam is incident on the primary conversion pad and on the secondary conversion pad simultaneously or alternately according to an incidence alternation ensuring said predetermined sequence for the emission of the first and second light radiations.

12. The optoelectronic device according to claim 11, wherein the illumination mechanism displacing mechanism comprises piezoelectric actuators and/or micro-actuators.

13. The optoelectronic device according to claim 1, wherein the initial light beam or the transformed light beam is configured so as to be able to be incident simultaneously on a portion of the primary conversion pad and on a portion of the secondary conversion pad.

14. The optoelectronic device according to claim 1, wherein the light adjustment system imposes that the predetermined sequence for the emission of the first and second light radiations has a frequency f for the emission alternations of the conversion pads of the pixel, expressed in Hz, such that $f \geq 24*n$ where n is the number of conversion pads of the pixel.

15. The optoelectronic device according to claim 1, wherein the light conversion module comprises at least one luminophore at the level of at least one conversion pad selected from the primary conversion pad and the secondary conversion pad.

16. A method for piloting an optoelectronic device comprising a plurality of pixels where each pixel is adapted to emit light beams of different colors, and each pixel comprises:
   a unique illumination mechanism comprising at least one light-emitting diode adapted to emit an initial light beam,
   a light conversion module including a plurality of conversion pads including at least one primary conversion pad adapted to emit a first light radiation corresponding to a first color from the initial light beam and at least one secondary conversion pad adapted to emit a second light radiation corresponding to a second color from the initial light beam,
   the method comprising a main phase including the following steps:
   a) emission of the initial light beam by the illumination mechanism so as to reach the primary conversion pad, resulting in the emission of the first light radiation;
   b) activation of a light adjustment system that each pixel includes, configured to act on at least one element selected from a relative position between the illumination mechanism and the light conversion module and the initial light beam (121), the activation of the light adjustment system being adapted so that the initial light beam could reach the secondary conversion pad;
   c) emission of the initial light beam by the illumination mechanism so as to reach the secondary conversion pad, resulting in the emission of the second light radiation;
   steps a) and c) being carried out simultaneously or alternately according to a predetermined sequence.

17. The method according to claim 16, wherein the main phase is repeated over time and wherein the time period between two successive main phases is shorter than 0.042 s.

18. The method according to claim 16, wherein the main phase is periodically repeated over time.

* * * * *